(12) United States Patent
Endo et al.

(10) Patent No.: US 7,065,686 B2
(45) Date of Patent: Jun. 20, 2006

(54) DUAL PORT RAM

(75) Inventors: Nobuyuki Endo, Kanagawa (JP); Yuji Fujiki, Tokyo (JP); Hiroki Goko, Tokyo (JP); Fumihiro Wajima, Saitama (JP); Junichi Tamura, Tokyo (JP); Ali Elhadri, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 475 days.

(21) Appl. No.: 10/173,826

(22) Filed: Jun. 19, 2002

(65) Prior Publication Data

US 2003/0140289 A1 Jul. 24, 2003

(30) Foreign Application Priority Data

Jan. 23, 2002 (JP) ............................. 2002-014707

(51) Int. Cl.
*G11C 29/00* (2006.01)
(52) U.S. Cl. .......................................... 714/718; 714/25
(58) Field of Classification Search ................ 714/718, 714/814, 733
See application file for complete search history.

(56) References Cited

U.S. PATENT DOCUMENTS 6,104,663 A * 8/2000 Kablanian .............. 365/230.05
6,269,036 B1 * 7/2001 Shubat ........................ 365/201
2003/0120974 A1 * 6/2003 Adams et al. ................ 714/31

OTHER PUBLICATIONS

Wang et al., "A Built-In Self-Test and Self-Diagnosis Scheme for Heterogeneous SRAM Clusters", Nov. 19-21, 2001, 10th Asian IEEE Test Symposium 2001, pp. 103-108.*
Wu et al., "Shadow Write and Read for At-Speed BIST of TDM SRAMs", Oct. 30-Nov. 1, 2001, IEEE International Test Conference 2001, pp. 985-994.*

* cited by examiner

*Primary Examiner*—Guy Lamarre
*Assistant Examiner*—John P Trimmings
(74) *Attorney, Agent, or Firm*—VolentineFrancos&Whitt PLLC

(57) ABSTRACT

A dual port RAM includes an any-time readable/writable memory block in which an access can be made to the same storage area from independent first and second ports. In addition, the RAM includes a first test circuit for performing a test to the storage area of the memory block via the first port on the basis of a first clock signal, and a second test circuit for performing a test to the storage area of the memory block via the second port on the basis of a second clock signal. A control circuit of the RAM causes the first and second test circuits to test the memory block in an alternating manner.

2 Claims, 3 Drawing Sheets

DUAL PORT RAM

BACKGROUND OF THE INVENTION

1. Field of the Invention

The present invention relates to a dual port RAM (random access memory) capable of writing or reading data to or from the same memory from two independent ports, and more particularly to its self-test function.

2. Related Background Art

A dual port RAM has a memory block and two ports A and B. If a normal operation is specified by a mode signal MOD in the dual port RAM, the port A of the memory block is connected to a system bus of a first functional block and is given a first clock signal. The port B of the memory block is connected to a system bus of a second functional block B and is given a second clock signal. In addition, a self-test circuit connected to the memory block is disconnected by a selector.

On the other hand, if a test operation is specified by a mode signal, the port A and the port B of the memory block are disconnected from the first and second functional blocks by the selector and then connected to the self-test circuit. A first clock signal is supplied to the port A of the memory block and the self-test circuit. Furthermore, a first clock signal is supplied to the port B of the memory block via a selector.

If a test start signal is given to the self-test circuit in this condition, the self-test circuit tests data write/read processing to or from the memory block and then a test result is output. In this self test, data written from the port A is read from the port B for verification or conversely data written from the port B is read from the port A for verification. Since a single self-test circuit is used for controlling the port A and the port B of the memory block simultaneously, these ports A and B are given a common clock signal (the first clock signal) for the read/write processing.

The above dual port RAM, however, has the following problem. In the self-test, there is a need for supplying the same first clock signal as one for the port A to the port B. Therefore, the first and second clock signals are switched to each other by using the selector on a clock supplying path in the side of the port B. This causes a difference in timing between the first clock signal supplied to the port A and the first clock signal supplied to the port B, which disables a normal self-test particularly in a fast operation, thus causing a problem.

Furthermore, there is a problem that the dual port RAM is incapable of performing a self-test when the first and second clock signals at the port A and the port B are different from each other in speed.

SUMMARY OF THE INVENTION

To solve the above problems of the conventional art, the present invention has been provided. It is an object of the present invention to provide a dual port RAM capable of performing a self-test with clock signals having two different timings.

According to one aspect of the present invention, there is provided a dual port RAM, comprising: an any-time readable/writable memory block in which an access can be made to the same storage area from independent first and second ports, a first test circuit for performing a test to the storage area of the memory block via the first port on the basis of a first clock signal, a second test circuit for performing a test to the storage area of the memory block via the second port on the basis of a second clock signal, and a control circuit for causing the first and second test circuits to test the memory block alternately.

DETAILED DESCRIPTION OF THE PREFERRED EMBODIMENTS

Figure 1:
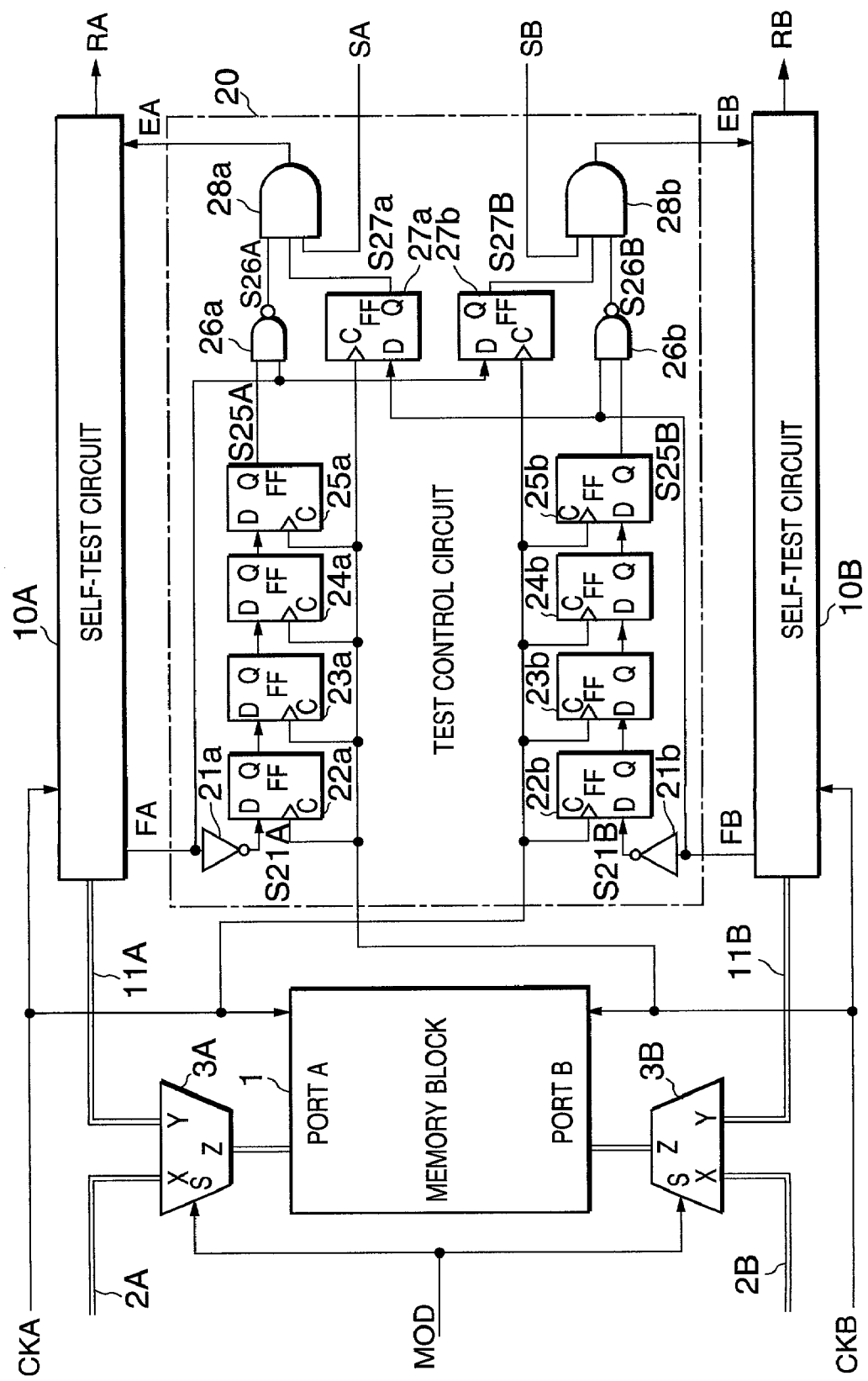
FIG. 1 is a configurational diagram of a dual port RAM showing a first embodiment of the present invention.

Referring to FIG. 1, there is shown a configurational diagram of a dual port RAM showing a first embodiment of the present invention.

This dual port RAM has a memory block 1 having two ports A and B. The port A of the memory block 1 is connected to a system bus 2A in the side of a functional block A (not shown) via a selector 3A and it is to be given a clock signal CKA. In addition, the port B of the memory block 1 is connected to a system bus 2B in the side of a functional block B (not shown) via a selector 3B and it is to be given a clock signal CKB.

Furthermore, this dual port RAM has self-test circuits 10A and 10B for testing the memory block 1. The self-test circuit 10A is given a clock signal CKA and is connected to the port A of the memory block 1 via the selector 3A through a bus 11A. The self-test circuit 10B is given a clock signal CKB and is connected to the port B of the memory block 1 via the selector 3B through a bus 11B.

The selectors 3A and 3B enable switching between a normal operation and a test operation by using a mode signal MOD given to a terminal S. In the normal operation, a connection is made between terminals X and Z, by which the port A and the port B of the memory block 1 are connected to the side of the functional blocks A and B, respectively. In the test operation, a connection is made between terminal Y and Z of the selectors 3A and 3B, by which the port A and the port B of the memory block 1 are connected to the self-test circuits 10A and 10B via the buses 11A and 11B, respectively.

The self-test circuit 10A tests the memory block via the port A in a given procedure when an enable signal EA is at level "H". After a completion of the given test, a completion signal FA output from the self-test circuit 10A sifts from level "L" to level "H" and then its test result RA is output. In the same manner, the self-test circuit 10B tests the memory block 1 via the port B in a given procedure when an enable signal EB is at level "H". After a completion of the given test, a completion signal FB output from the self-test circuit 10B shifts from level "L" to level "H" and then its test result RB is output.

This dual port RAM has a test control circuit 20 for operating two self-test circuits 10A and 10B alternately.

The test control circuit 20 has an inverter 21a to be given a completion signal FA from the side of the port A and the inverter 21a is connected in its output to FFs 22a, 23a, 24a, and 25a having four stages. Each clock terminal C of the FFs 22a to 25a is given a clock signal CKB from the side of the port B. An output of the FF 25a is connected to a first input of a two-input negative AND gate (hereinafter, referred to as NAND) 26a and a second input of the NAND 26a is given a completion signal FA.

In addition, the test control circuit 20 has an FF 27a for holding a completion signal FB in the side of the port B at a rise of the clock signal CKB. Outputs of the FF 27a and the NAND 26a are connected to first and second inputs of a three-input AND gate (hereinafter, referred to as AND) 28a and a third input of the AND 28a is given a start signal SA. The enable signal EA is output from an output of the AND 28a and given to the self-test circuit 10A.

Furthermore, this test control circuit 20 has an inverter 21b to be given the completion signal FB from the side of the port B and an output of the inverter 21b is connected to FFs 22b, 23b, 24b, and 25b having four stages. Each clock terminal C of the FFs 22b to 25b is given a clock signal CK from the side of the port A. An output of the FF 25b is connected to a first input of a two-input NAND 26b and a second input of the NAND 26b is given a completion signal FB.

In addition, the test control circuit 20 has an FF 27b for holding a completion signal FA in the side of the port A at a rise of the clock signal CKA. Outputs of the FF 27b and the NAND 26b are connected to first and second inputs of a three-input AND 28b and a third input of the AND 28b is given a start signal SB. The enable signal EB is output from an output of the AND 28b and given to the self-test circuit 10B.

Figure 2:
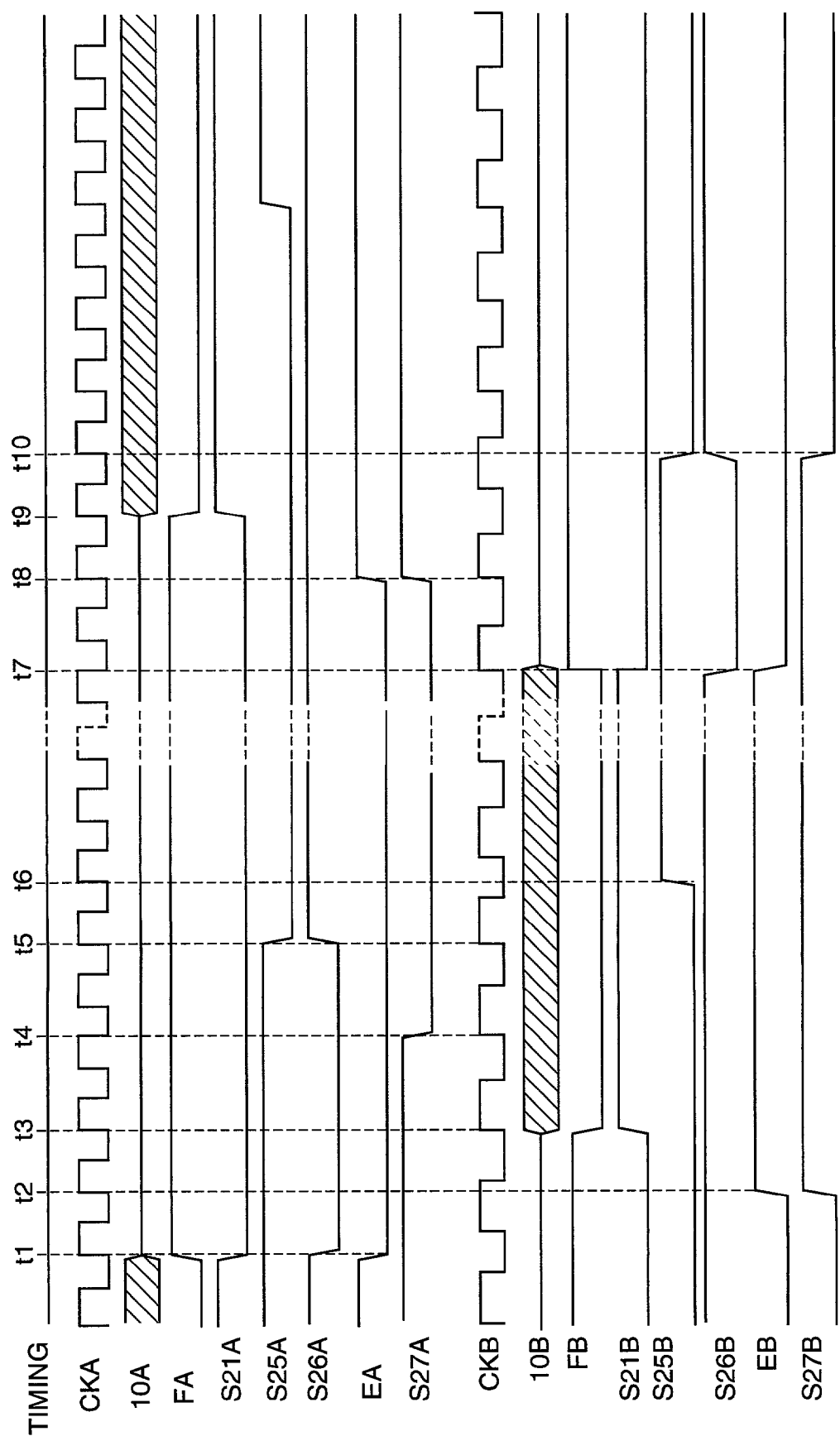
FIG. 2 is a signal waveform diagram showing a self-test operation in FIG. 1.

Referring to FIG. 2, there is shown a signal waveform diagram showing a self-test operation in FIG. 1. Hereinafter, the operation in FIG. 1 will be described by referring to FIG. 2.

In the normal operation, the selectors 3A and 3B are switched to the side of the terminal X with a mode signal MOD, by which the port A of the memory block 1 is connected to the system bus 2A of the functional block A and is given a clock signal CKA. In addition, the port B of the memory block 1 is connected to the system bus 2B of the functional block B and is given a clock signal CKB. The memory block 1 is disconnected from the self-test circuits 10A and 10B by the selectors 3A and 3B.

In the self-test operation, the selectors 3A and 3B are switched to the side of the terminal Y with a mode signal MOD, by which the port A and the port B of the memory block 1 are disconnected from the functional blocks A and B by the selectors 3A and 3B and then connected to the self-test circuits 10A and 10B. In addition, the port A of the memory block 1 and the self-test circuit 10A are given a clock signal CKA and the port B and the self-test circuit 10B are given a clock signal CKB.

At this point, it is assumed that a test of the memory block 1 is repeated sequentially at addresses within a given range in the following procedure, for example:

Phase 1: Reading data from the port A and comparing it with an expected value
Phase 2: Reading data from the port B and comparing it with an expected value
Phase 3: Writing data from the port A
Phase 4: Reading data from the port A and comparing it with an expected value
Phase 5: Reading data from the port B and comparing it with an expected value In this case, an access change from the port A to the port B occurs between the phase 1 and the phase 2 and between the phase 4 and the phase 5. An access change from the port B to the port A occurs between the phase 2 and the phase 3 and between the phase 5 and the phase 1 of the next address.

For example, a start signal SA at level "H" and a start signal SB at level "L" are given, first, by which the self-test circuit 10B is forcibly halted and the self-test circuit 10A starts to operate. After starting the operation of the self-test circuit 10A, the start signal SB is set to level "H".

When the test of the self-test circuit 10A in the side of the port A terminates at time t1 in FIG. 2, the completion signal FA shifts from level "L" to level "H". This causes a signal S21A output from the inverter 21a to shift from "H" to "L". Additionally, a signal S26A output from the NAND 26a also shifts to "L", by which an enable signal EA output from the AND 28a shifts to "L".

After that, a signal S27B output from the FF 27b shifts from "L" to "H" at a rise of the clock signal CKA at time t2, by which an enable signal EB output from the AND 28b shifts to "H".

When the clock signal CKB in the side of the port B rises at time t3, an operation of the self-test circuit 10B starts and the completion signal FB shifts from "H" to "L". This causes a signal S21B output from the inverter 21b to shift from "L" to "H".

With the next rise of the clock signal CKB at time t4, a signal S27A output from the FF 27a shifts from "H" to "L".

At time t5, the signal S25A output from the FF 25a shifts from "H" to "L" with the fourth rise of the clock signal CKB after time t1. This causes the signal S26A of the NAND 26a to return to "H". The signal S27A of the FF 27a, however, is at "L" and therefore the enable signal EA remains at "L".

At time t6, the signal S25B output from the FF 25b shifts from "L" to "H" with the fourth rise of the clock signal CKA after time t3. At this point, the completion signal FB is at "L" and therefore a signal S26B output from the NAND 26b remains at "H" and the enable signal EB is kept to be at "H".

When the test of the self-test circuit 10B in the side of the port B terminates at time t7, the completion signal FB shifts from "L" to "H". This causes the signal S21B of the inverter 21b to shift from "H" to "L". In addition, the signal S26B of the NAND 26b also shifts to "L", by which the enable signal EB shifts to "L".

After that, the signal S27A of the FF 27a shifts from "L" to "H" with a rise of the clock signal CKB at time t8, by which the enable signal EA shifts to "H".

When the clock signal CKA in the side of the port A rises at time t9, the operation of the self-test circuit 10A starts and the completion signal FA shifts from "H" to "L". This causes the signal S21A of the inverter 21a to shift from to "H".

With the next rise of the clock signal CKA at time t10, the signal S27B of the FF 27b shifts from "H" to "L".

Thereafter, the test control circuit 20 controls the self-test circuits 10A and 10B to perform the test operation alternately with the same repetition.

As set forth hereinabove, the dual port RAM according to the first embodiment has the self-test circuits 10A and 10B operating with the clock signals CKA and CKB of the port A and the port B and the test control circuit 20 for controlling the self-test circuits 10A and 10B so as to operate alternately. This enables a self-test of the memory block 1 with the clock signals CKA and CKB having two different timings, advantageously.

Figure 3:
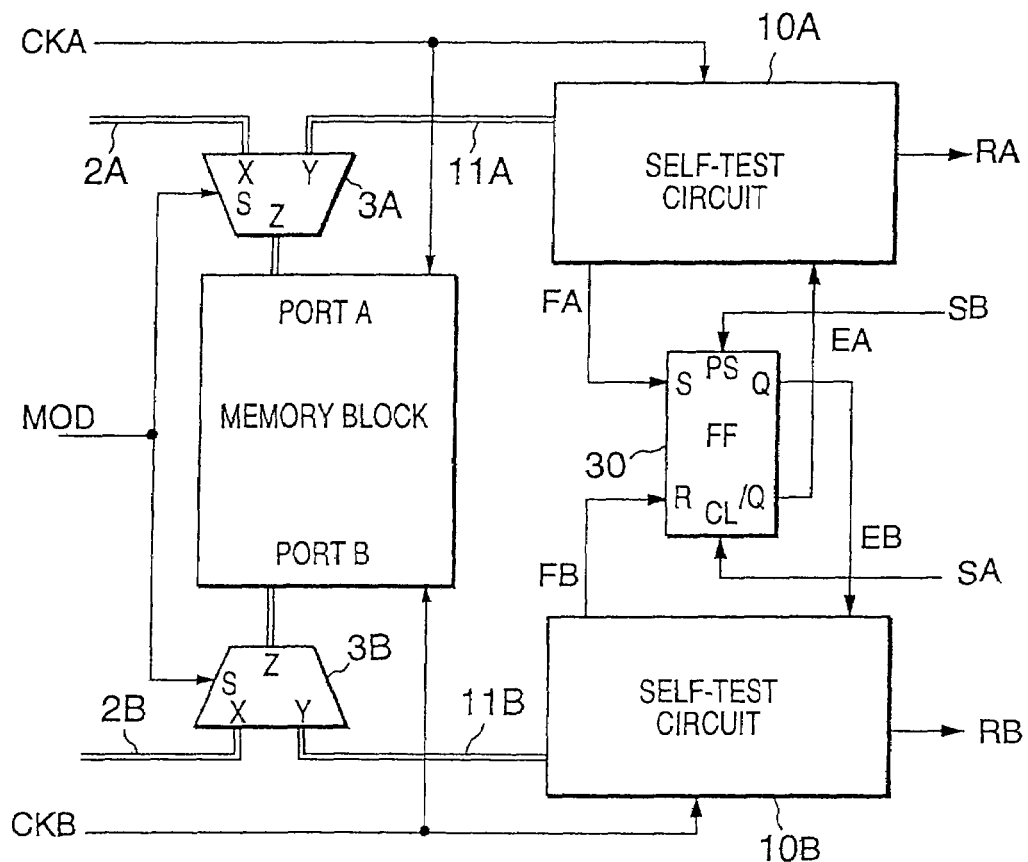
FIG. 3 is a dual port RAM showing a second embodiment of the present invention.

Referring to FIG. 3, there is shown a configurational diagram of a dual port RAM showing a second embodiment of the present invention. The same elements as in FIG. 1 are designated by the same reference numerals.

This dual port RAM has a set/reset-type FF 30 instead of the test control circuit 20 of the dual port RAM in FIG. 1.

The FF 30 retains data having level "H" and outputs signals at "H" and "L" to output terminals Q and /Q when a pulse having level "H" is applied to a set terminal S and it retains data having "L" and outputs signals at "L" and "H" to the output terminals Q and /Q when a pulse having "H" is applied to a reset terminal R. Furthermore, the FF 30 has a preset terminal PS and a clear terminal CL so as to set retained data to "H" by applying a pulse at "H" to the preset terminal PS and so as to reset the retained data to "L" by applying a pulse at "H" to the clear terminal CL.

The set terminal S of the FF 30 is given the completion signal FA of the self-test circuit 10A and the reset terminal R is given the completion signal FB of the self-test circuit 10B. The enable signal EB is output from the output terminal Q to the self-test circuit 10B and the enable signal EA is output from the output terminal /Q to the self-test circuit 10A. Furthermore, the clear terminal CL and the preset terminal PS are given start signals SA and SB, respectively. Other components are the same as in FIG. 1.

Figure 4:
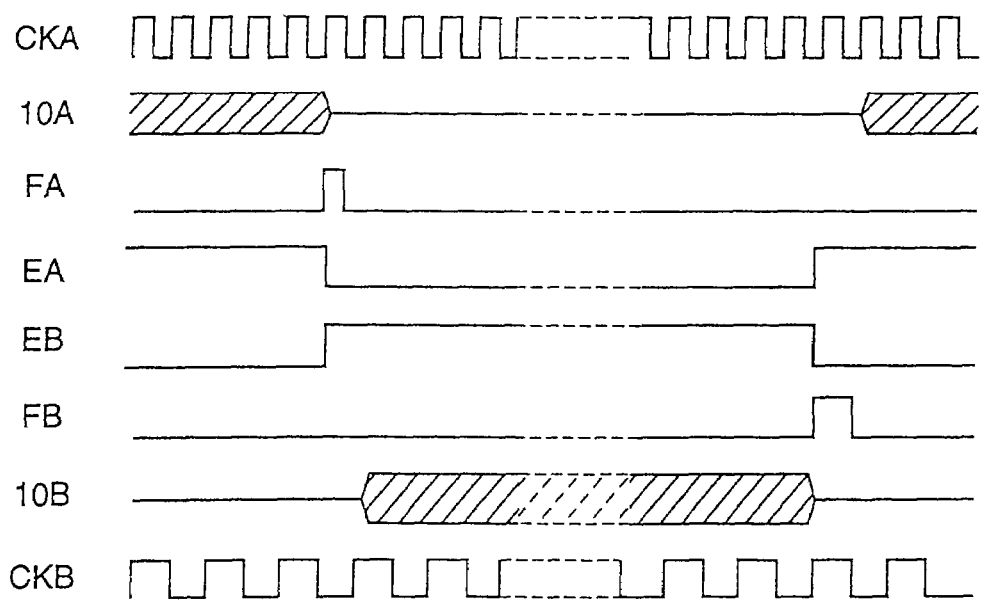
FIG. 4 is a signal waveform diagram showing a self-test operation in FIG. 3.

Referring to FIG. 4, there is shown a signal waveform diagram showing a self-test operation in FIG. 3. Hereinafter, the self-test operation in FIG. 3 will be described by referring to FIG. 4.

A supply of the start signal SA at the start of the self-test clears the FF 30, by which the enable signal EB output from the output terminal Q to the self-test circuit 10B shifts to "L" and the enable signal EA output from the output terminal /Q to the self-test circuit 10A shifts to "H". This causes the self-test circuit 10A to perform the self-test of the memory block 1 via the port A on the basis of the clock signal CKA.

After a completion of the operation of the self-test circuit 10A, the self-test circuit 10A outputs a pulse of the completion signal FA. This causes the FF 30 to be set, by which the enable signal EB output from the output terminal Q to the self-test circuit 10B shifts to "H" and the enable signal EA output from the output terminal /Q to the self-test circuit 10A shifts to "L".

When the enable signal EB shifts to "H" the self-test circuit 10B starts to operate at a timing of the next rise of the clock signal CKB. Then, the self-test circuit 10B performs a self-test of the memory block 1 via the port B on the basis of the clock signal CKB.

After a completion of the operation of the self-test circuit 10B, the self-test circuit 10B outputs a pulse of the completion signal FB. This causes the FF 30 to be reset, by which the enable signal EB output from the output terminal Q to the self-test circuit 10B shifts to "L" and the enable signal EA output from the output terminal /Q to the self-test circuit 10A shifts to "H".

Thereafter, the self-test circuits 10A and 10B are controlled to perform test operations alternately by the same repetition.

As set forth hereinabove, the dual port RAM according to the second embodiment has the self-test circuits 10A and 10B operating with the clock signals CKA and CKB of the port A and the port B and the FF 30 for controlling the self-test circuits 10A and 10B so as to operate alternately. This simplifies a circuitry advantageously in addition to the same advantage as for the first embodiment.

The present invention is not limited to the above embodiments, but various modifications are possible. There is the following modification, for example:

(a) The circuitry of the test control circuit 20 shown in FIG. 1 is not limited to one shown there. For example, the number of stages for the FFs 22a to 25a can be set to an appropriate one according to a frequency or the like of the clock signals CKA and CKB. In addition, a delay circuit or the like can be used instead of the FFs 22a to 25a.

(b) Though the FF 30 in FIG. 3 has a preset function for initially starting one of the self-test circuits 10A and 10B, it is also possible to use a different circuit to start the self-test circuit 10A or 10B.

As set forth hereinabove in detail, the present invention comprises a first test circuit for performing a test to a storage area of a memory block via a first port on the basis of a first clock signal, a second test circuit for performing a test to the storage area of the memory block via the second port on the basis of a second clock signal, and a control circuit for causing the first and second test circuits to test the memory block alternately. This enables a self-test of the memory block via the first and second ports with clock signals having two different timings.

Furthermore, according to the present invention, the first test circuit starts a test operation on the basis of a first enable signal and outputs a first completion signal when the test operation completes and the second test circuit starts the test operation on the basis of a second enable signal and outputs a second completion signal when the test operation completes. Furthermore, the control circuit outputs the second enable signal on the basis of the first completion signal while halting the first enable signal and outputs the first enable signal on the basis of the second completion signal while halting the second enable signal. This causes the two test circuits to test the storage area of the memory block alternately, thereby enabling the test with clock signals having two different timings without problems.

What is claimed is:

1. A dual port RAM, comprising:
   an any-time readable/writable memory block in which an access can be made to a same storage area from independent first and second ports;
   a first self-test circuit for performing a test to the storage area of said memory block via said first port on the basis of a first clock signal;
   a second self-test circuit for performing a test to the storage area of said memory block via said second port on the basis of a second clock signal; and
   a control circuit for causing said first and second self-test circuits to test said memory block alternately,
   wherein the first and second self-test circuits are connected to different lines to receive different clock signals respectively,
   wherein said first self-test circuit starts a test operation on the basis of a first enable signal and outputs a first completion signal when the test operation of said first self-test circuit is complete, and said first enable signal is stopped by said first completion signal,
   wherein said second self-test circuit starts a test operation on the basis of a second enable signal and outputs a second completion signal when the test operation of said second self-test circuit is complete, and said second enable signal is stopped by said second completion signal, and
   wherein said control circuit outputs said second enable signal on the basis of said first completion signal while halting said first enable signal, and outputs the first enable signal on the basis of said second completion signal while halting said second enable signal.

2. The dual-port RAM according to claim 1, wherein said control circuit is a set/reset-type flip-flop.

* * * * *